United States Patent
Becker et al.

[11] Patent Number: 6,039,114
[45] Date of Patent: Mar. 21, 2000

[54] COOLING BODY HAVING LUGS

[75] Inventors: Klaus Becker, Gross-Gerau; Wolfgang Staiger, Stuttgart; Matthias Jung; Peter Heinemeyer, both of Berlin, all of Germany

[73] Assignee: Daimler - Benz Aktiengesellschaft, Stuttgart, Germany

[21] Appl. No.: 08/894,988

[22] PCT Filed: Jan. 2, 1997

[86] PCT No.: PCT/EP97/00002

§ 371 Date: Sep. 4, 1997

§ 102(e) Date: Sep. 4, 1997

[87] PCT Pub. No.: WO97/25741

PCT Pub. Date: Jul. 17, 1997

[30] Foreign Application Priority Data

Jan. 4, 1996 [DE] Germany ............................ 196 00 164
Jan. 4, 1996 [DE] Germany ............................ 196 00 166

[51] Int. Cl.⁷ ...................................................... F28F 3/12
[52] U.S. Cl. ............................ 165/170; 165/80.4; 165/146
[58] Field of Search ..................................... 165/146, 170, 165/80.4

[56] References Cited

U.S. PATENT DOCUMENTS

| 3,524,497 | 8/1970 | Chu et al. ................................ 165/80.4 |
| 4,151,548 | 4/1979 | Klein et al. ........................ 165/80.4 X |
| 4,450,472 | 5/1984 | Tuckerman et al. ................ 165/80.4 X |
| 4,467,860 | 8/1984 | Wargo . |
| 4,541,004 | 9/1985 | Moore . |
| 4,884,630 | 12/1989 | Nelson et al. ........................... 165/170 |
| 5,239,200 | 8/1993 | Messina et al. .................... 165/80.4 X |

FOREIGN PATENT DOCUMENTS

| 383228 | 6/1987 | Austria . |
| 0353437 | 2/1990 | European Pat. Off. . |
| 2640000 | 3/1978 | Germany . |
| 3408771 | 9/1985 | Germany . |
| 4017749 | 12/1991 | Germany . |
| 4202024 | 7/1993 | Germany . |
| 4322933 | 1/1995 | Germany . |
| 860176 | 8/1981 | U.S.S.R. . |

Primary Examiner—Allen Flanigan
Attorney, Agent, or Firm—Venable; George H. Spencer; Catherine M. Voorhees

[57] ABSTRACT

The invention relates to a cooling body comprising a heat-conducting insulator and having lugs that are attached in the interior of the cooling body.

22 Claims, 4 Drawing Sheets

COOLING BODY HAVING LUGS

BACKGROUND OF THE INVENTION

The invention relates to a cooling body having an upper part, a lower part and lugs that are attached with material-to-material binding to at least one inside surface of the upper and lower parts, project into the cooling medium and are separated by channels.

German patent DE 40 17 749 discloses a cooling body assembled from an upper and a lower half, and in which lugs are disposed, with material-to-material bonding, on the inside surface of such a half, perpendicularly in the flow path of the cooling medium.

The problem of an arrangement of this type is that the heat dissipation of some components on the outside surfaces of the cooling body is inhomogeneous. The flow path is short-circuited between the cooling-medium inlet and the cooling-medium outlet. Therefore, hot zones form on the outside surfaces. The heat resistance of the arrangement of DE 40 17 749 is also high, approximately 30 K/kW, which leads to overheating of the cooling medium.

SUMMARY OF THE INVENTION

It is therefore the object of the invention to provide a cooling body having a lug arrangement that improves the flow conditions in the cooling body.

The object is accomplished by providing a greater ratio of the volume percent of the lugs to the volume percent of the channels in the region of an imaginary, direct connecting line between a cooling-medium outlet and a cooling-medium inlet than in the regions outside of the imaginary connecting line. Refining and advantageous embodiments ensue from the description.

In the cooling body of the invention, the local density of the lugs is selected such that an essentially homogeneous flow resistance dominates in the interior of the cooling body. A short-circuiting of the flow path of the cooling medium is prevented, and the cooling medium flows uniformly around the lugs.

It is especially advantageous if the lugs attached with material-to-material bonding to at least one inside surface additionally converge to a point, and the respective lug contact surface with an inside surface of the cooling body has the largest lug cross section. This reduces the heat resistance of the arrangement.

It is also advantageous to assemble the cooling body from a plurality of detachable parts. In one modification, which possesses the original, inventive form, the lugs (5, 5') are disposed along the flow path with an opening angle of 40° to 60°.

The cooling body of the invention is distinguished by the embodiment of the lugs, which is beneficial to flow, and by a high filling ratio of lugs in the interior of the cooling body.

It is particularly advantageous if the lugs attached with material-to-material bonding to at least one inside surface converge to a point, and the respective lug contact surface with an inside surface of the cooling body has the largest lug cross-sectional surface. The heat resistance of the arrangement is thus reduced.

BRIEF DESCRIPTION OF THE DRAWINGS

The invention is described in detail below in conjunction with drawings.

Shown are in.

DESCRIPTION OF THE PREFERRED EMBODIMENTS

Figure 1A:
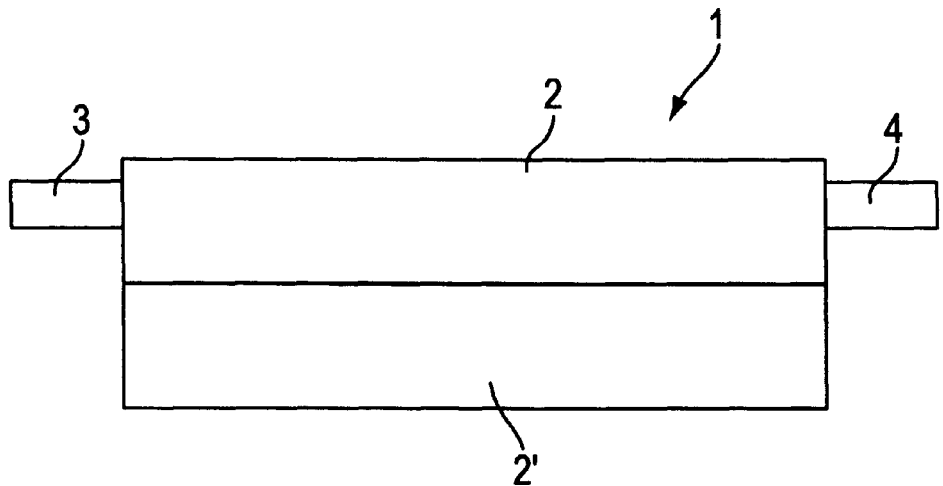
FIG. 1*a* is a side view of a cooling body.

FIG. 1*a* shows a side view of a cooling body 1 of the invention, having an upper and a lower part 2 and 2', respectively. The connections for cooling-medium inlet 3 and cooling-medium outlet 4 are indicated. The connections 3 and 4 can be disposed on opposite sides or on the same side. The two parts 2 and 2' are connected to one another, and can be glued, sintered, screwed or clipped together, for example, or connected by way of an intermediary. The cooling body is suitable for liquid cooling media, for example, but can also be used for gaseous cooling media.

Figure 1B:
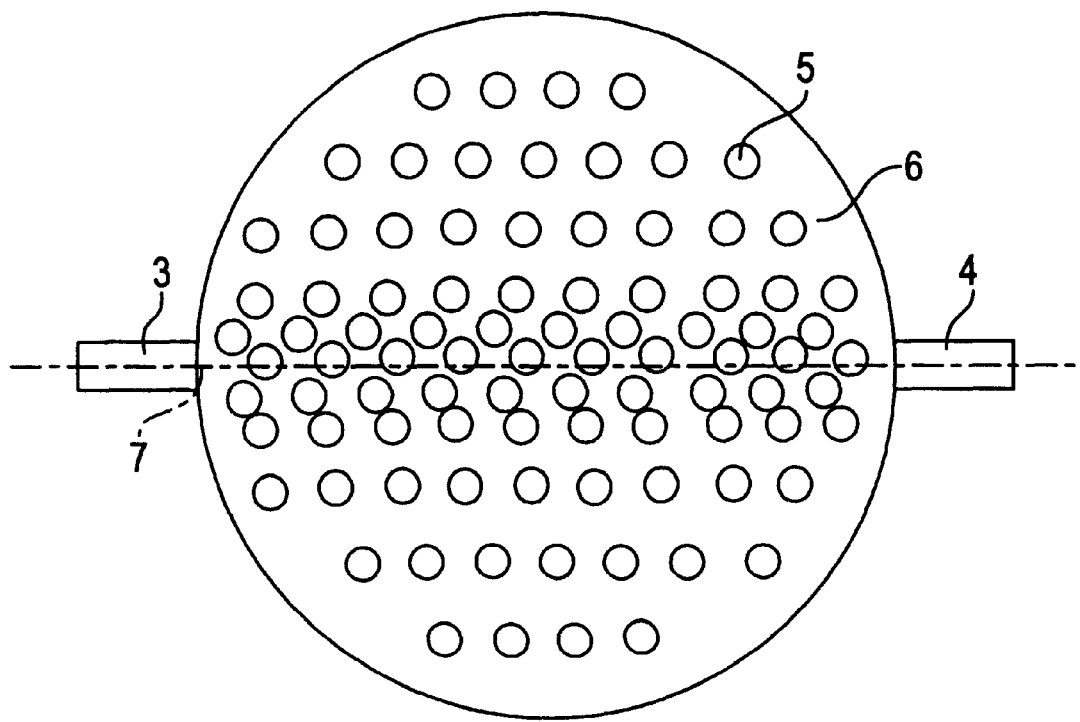
FIG. 1*b* is a plan view of the inside of a cooling-body half with non-uniformly-distributed lugs.

FIG. 1*b* shows a plan view of the inside surface of the cooling-body part 2 of the cooling body 1, with the wall being shown schematically as a circle. A plurality of lugs 5 is disposed on the inside surface of the cooling-body part 2. The lugs 5 are separated by channels 6, and are non-uniformly distributed over the inside surface of the cooling-body part 2. The filling ratio of the lugs 5 in the region of the imaginary, direct connecting line 7 between cooling-medium inlet 3 and cooling-medium outlet 4 is high, and lower further away from imaginary, direct connecting line 7, so that flow resistance is approximately the same over the surface for each possible flow path between cooling-medium inlet 3 and cooling-medium outlet 4. The region along the imaginary direct connecting line 7 which has the higher lug density is at least as wide as the smaller of the diameters of the cooling-medium inlet 3 and outlet 4.

An average lug density of 2–7 lugs/cm$^2$, particularly 4–6 lugs/cm$^2$, is advantageous in this region, because with this density the tools can still be handled well in a possible ceramic-processing technique for the cooling body 1. The resulting small channel width is advantageous for the flow speed of the cooling medium. The arrangement has a low heat resistance of only 20 K/kW.

The filling ratio varies from 1:1 (empty space to volume percent of material) to 2:1. The advantage of this is that the production of the tools for producing this type of cooling body, for example pressing and sintering of ceramic, is still simple for this filling ratio. As a result rejected parts due to break-off of lugs 5, 5' or channels 6 is avoided. Moreover, the flow speed with conventional cooling-medium flows of about 10 1/min is sufficiently high for adequate heat dissipation, but still low enough not to cause abrasive damage to the cooling body 1.

The variation of the filling ratio can be attained by the omission or addition of lugs 5, 5' or the enlargement or reduction of lugs 5, 5' or channels 6, or a change in the lug or channel size with unchanged channels 6 or lugs 5, 5'. An essential point is that the maximum flow speed of the cooling medium along the channels 6 is no more than 50%, particularly not more than 30%, above or below the average flow speed maximum in each channel.

The lugs can have an arbitrary shape. It has been seen, however, that a special outline of the lugs 5, 5' is particularly advantageous.

Figure 2:
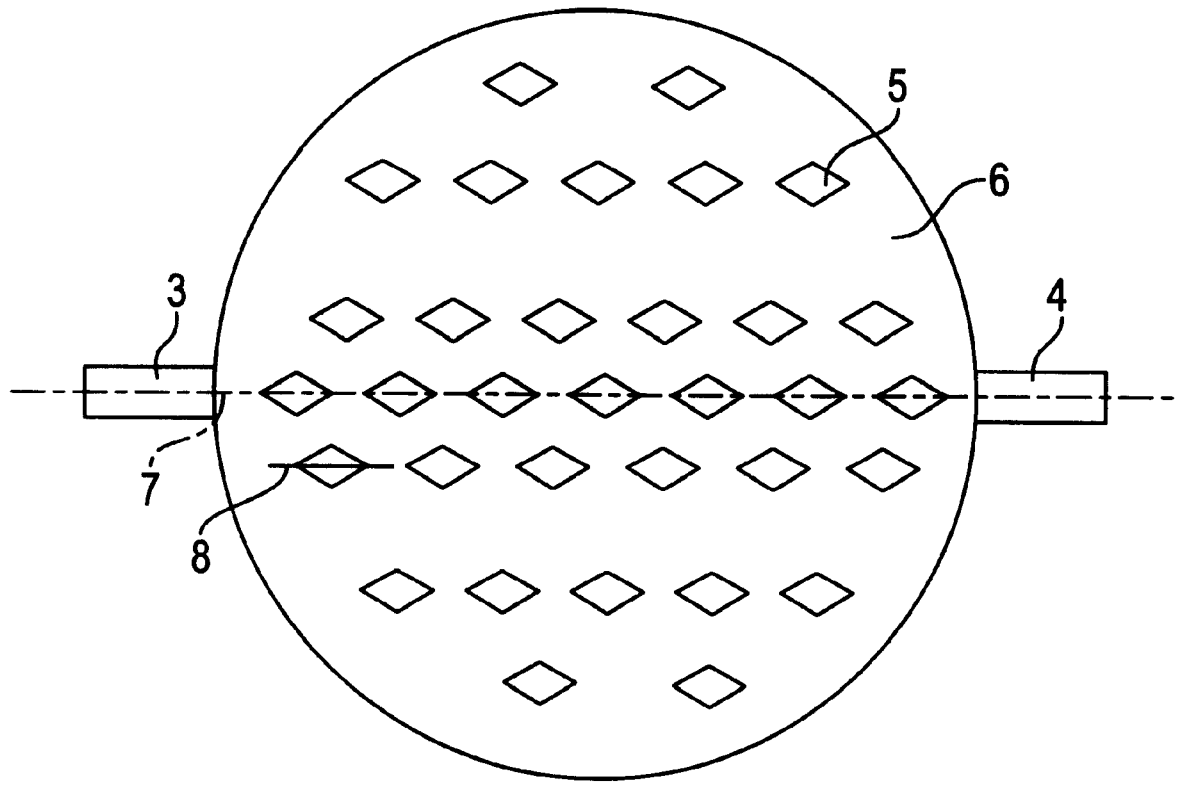
FIG. 2 is a view from above of the inside of a further embodiment of a cooling-body half with non-uniformly-distributed lugs.

FIG. 2 shows a plan view of the inside surface of a cooling-body part 2 of an especially useful embodiment of a cooling body 1. A plurality of lugs 5 beneficial to flow is disposed on the inside surface of the cooling body 2. The outline of the lugs is rhomboid, with the long diagonal 8 of the lug 5 being disposed approximately parallel to the possible cooling-medium flow path. The rhomboid shape is particularly useful, because no buildup point can form at the tip of the lug 5 surrounded by flow. Instead, the flow of the cooling medium is divided, and can flow around and cool the lug 5.

It has been seen that, especially with this lug shape, the surface-volume ratio is very favorable, which further improves the possible heat dissipation. In the use of a thermally well-conducting material such as aluminum nitride, the heat-transfer constant of this arrangement is 3000 $W/(m^2K)$.

The flow around the lugs 5 having a rhomboid outline is especially advantageous if the opening angle of the front tip of each rhombus 5 surrounded by flow is between 40° and 60°, particularly between 46° and 55°, because the flow speed around the lug is then maximal, that is, overflow length is short. With larger angles or, for example, in cylindrical lugs, the formation of buildup points on the side of the lugs 5 surrounded by flow worsens the flow-around; with smaller angles, the mechanical stability of the lugs 5 surrounded by flow is reduced. Furthermore, the overflow length is too long with a predetermined, favorable lug density, and worsens the heat dissipation from the lug 5.

Figure 3A:
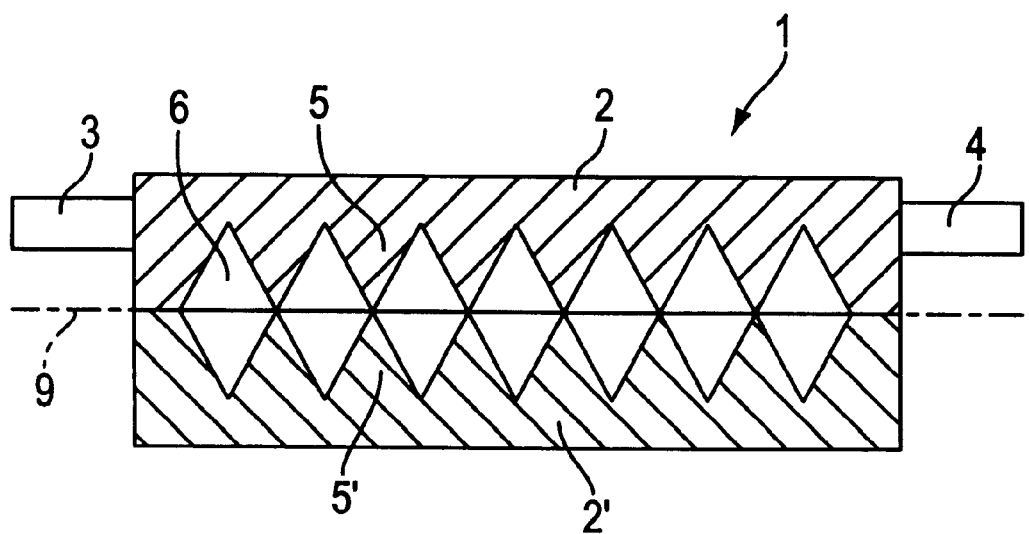
FIG. 3*a* is a side view of a cooling body with lugs disposed in a row, in longitudinal section.

FIG. 3a shows a cross-section of a further, advantageous lug shape. The lugs 5 converge in cone shape into the interior of the cooling body 1, and contact the inside surface 2 of the cooling body 1 with their largest cross-sectional surface. The tip of the lugs 5 can be pointed or flattened. Thus, the heat dissipation can be further improved, because a hot side of the cooling body is contacted over a large surface, and the heat-conducting lugs 5, 5' have a large-surface contact with the cooling medium. At the same time, with this lug shape, costly base material can be saved in the production of the cooling body 1.

In the illustrated example, the two cooling-body parts 2, 2' of the cooling body are disposed symmetrically with respect to the plane of mirror symmetry 9 between the two cooling-body parts 2 and 2'; the lugs 5, 5' are directly opposite one another in the fully-assembled state of the cooling body 1.

Figure 3B:
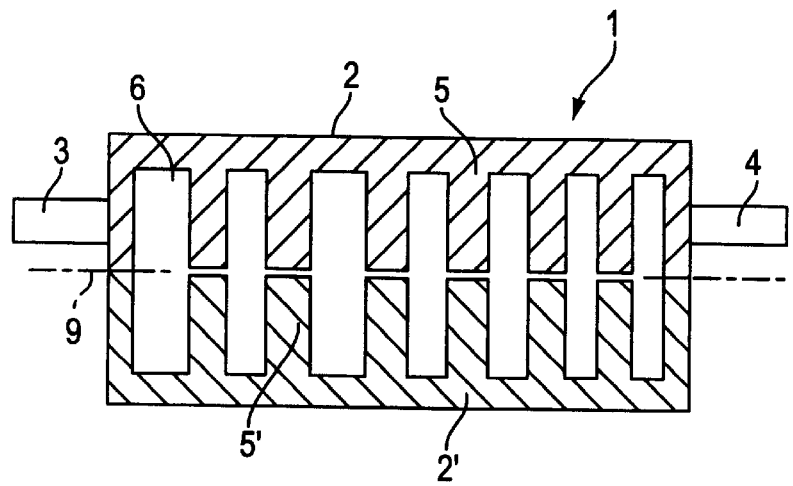
FIG. 3*b* is a view of another embodiment of a cooling body with lugs disposed in a row, in longitudinal section.

FIG. 3b shows a mirror-symmetrical arrangement of the lugs 5, 5'. The two cooling-body parts 2, 2' have lugs 5, 5' on their insides. The arrangement is symmetrical with respect to the plane of mirror symmetry 9 between the two cooling-body halves 2 and 2'; the lugs are directly opposite one another in the fully-assembled state of the cooling body 1.

Figure 3C:
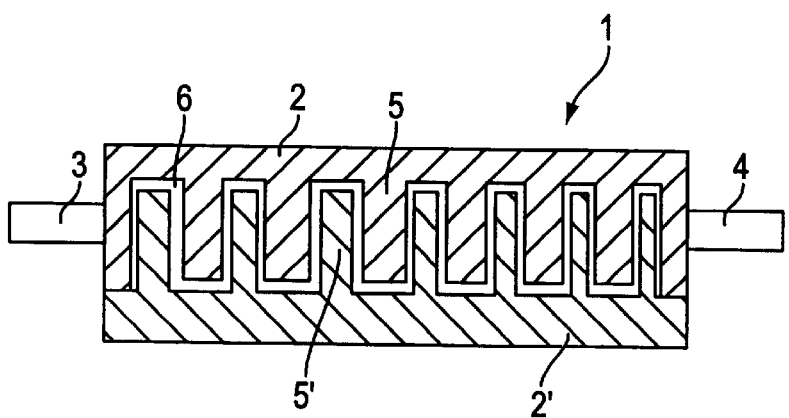
FIG. 3*c* is a view of a cooling body having lugs that extend between one another, in longitudinal section.

FIG. 3c shows an arrangement that permits a particularly high filling ratio of the lugs. The lugs 5, 5' of the upper and lower cooling-body parts 2, 2' are offset with respect to one another, and extend between one another. Thus, the cooling-medium speed can be further increased, because the channels 6 are also narrow in the center region of the cooling body 1, where the two cooling-body parts 2 and 2' meet. In principle, different lug shapes and outlines can also be selected in this arrangement.

Heat dissipation is basically optimal if the cooling-medium speed is so high that a turbulent flow forms. It has been seen, however, that the cooling medium erodes the cooling body at such high speeds.

The minimum heat-transfer coefficient x of the cooling body 1 of the invention should be no smaller than 3000 $W/(m^2K)$. The cooling is insufficient at lower x values. For water as a cooling medium, a minimum flow speed of 0.1 m/sec results, with 1 kW dissipated energy.

It is essential that the flow speed not drop below a minimum value of about 0.1 m/sec. The cooling-medium speed that cannot be exceeded as the upper flow-speed limit is the speed at which the cooling body 1 is damaged through abrasion. This limit is 1 m/sec, for example, for aluminum nitride, and 1.5 m/sec for aluminum.

Although the flow of the cooling medium, for example water, is still laminar, the cooling body 1 of the invention effects a distinct reduction in the heat resistance. The heat resistance is clearly below 30 K/kW. For the data disclosed for the example, the value is, for example, 20 K/kW.

Figure 4:
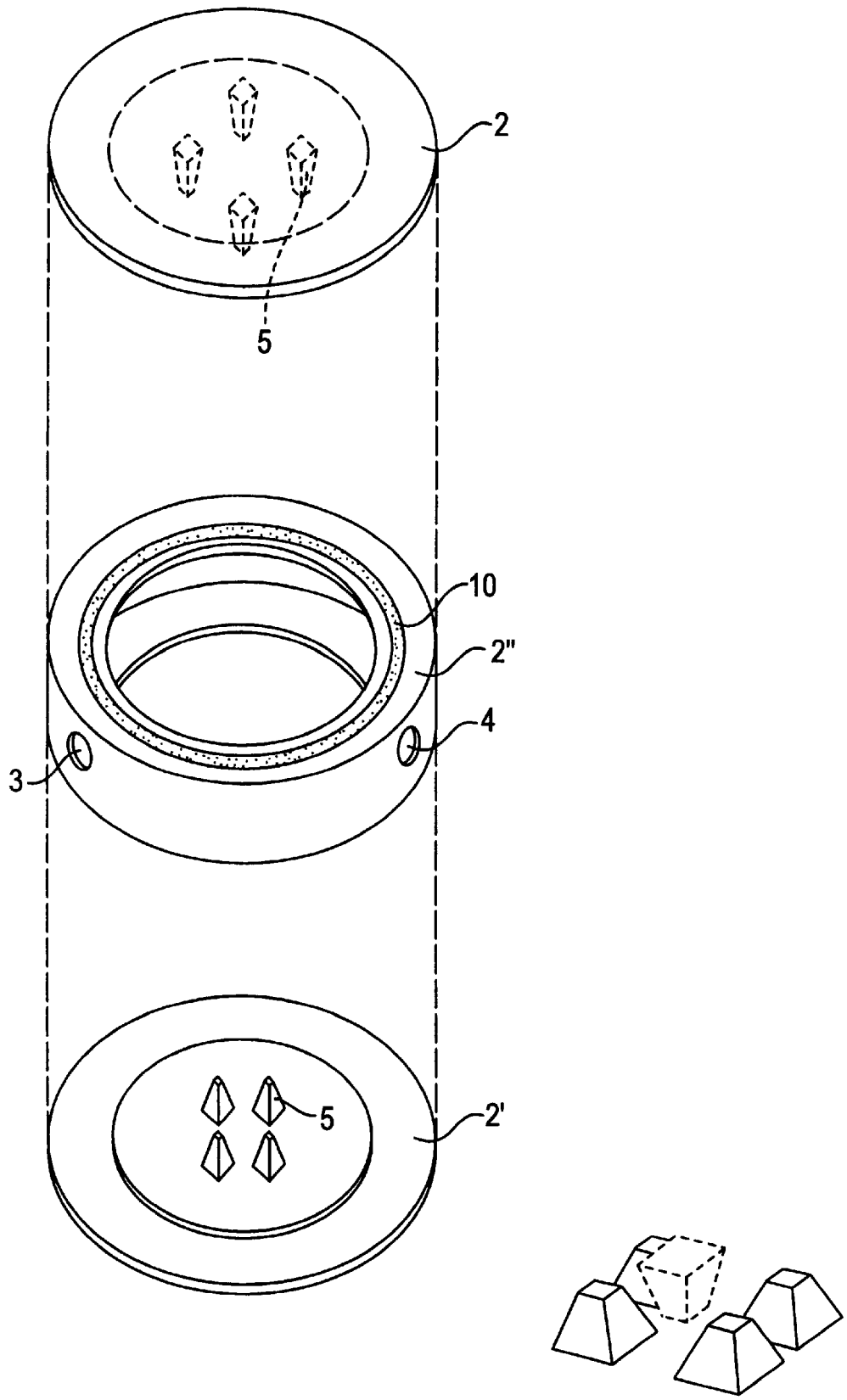
FIG. 4 illustrates the structure of a multiple-part cooling body.

FIG. 4 illustrates a further, advantageous embodiment of a cooling body 1 of the invention that has an upper part 2, a lower part 2' and an annular center part 2". The cooling-medium inlet 3 and outlet 4 can be disposed on opposite sides or the same sides of the circumference of the center part 2". Lugs 5 and 5' are disposed on the inside of the upper part 2 and the lower part 2'. The parts 2 and 2' are sealed and detachably connected with the center part 2" by sealing means 10. The lower sealing means 10' is not shown. Examples of suitable sealing means include elastic flat seals or toroidal sealing rings, for example comprising Perbunan or Viton. The detachable connection can be produced by clips, bushings or the like.

Figure 5:
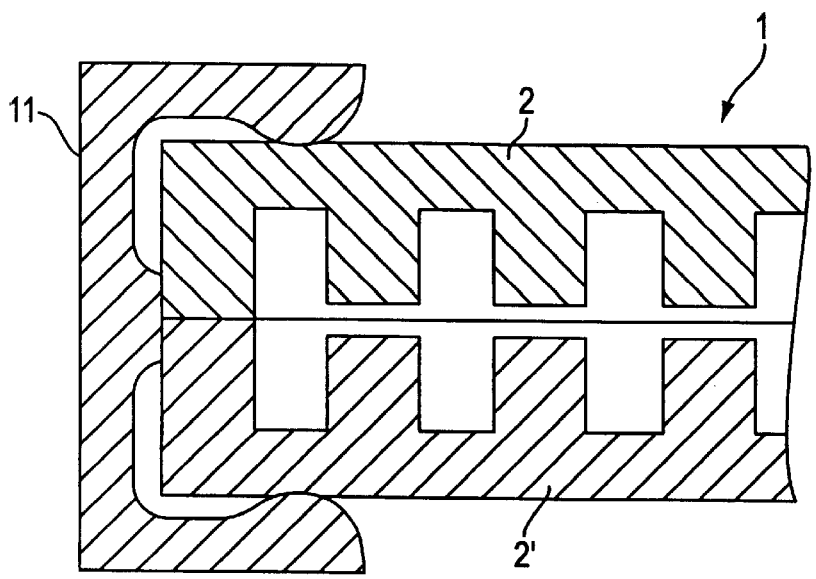
FIG. 5 is a sectional side view showing a clip for connecting the parts of a multiple-part cooling body.

FIG. 5 shows a connecting clip of this type, with which the cooling-body parts 2, 2' and 2" can be detachably connected to one another. A plurality of clips of this type is disposed at the outer edge of the cooling body 1. This type of connection is particularly advantageous in the stacked arrangement, in which a plurality of cooling bodies and power components to be cooled, e.g. in electric-motor power trains, are disposed one behind the other. The actual holding force the presses the parts together is exerted by the clamping apparatus of the stack, and is usually about 40 kN in the known cooling-body stacks. Clipping the individual cooling bodies significantly facilitates maintenance and the exchange of defective components or cooling bodies from the stack.

The center part 2" itself is hollow, and has connections 3 and 4 for the cooling medium. It is particularly advantageous if this center part comprises metal (aluminum or copper or other inexpensive materials) or plastic. Whereas, in ceramic bodies, connecting cooling-medium lines is technically complicated, this task is greatly simplified in the arrangement of the invention. The connections, such as commercially-available flange connections or supports, can be secured via screw threads, for example, to the center part 2" or welded to it.

In the use of insulating, heat-conducting ceramics for the parts 2 and 2', it is possible to save a considerable amount of material overall in producing the cooling body 1, and thus to save money on the expensive base materials, without impairing the necessary high-voltage capability of the cooling arrangement. Likewise, the sealing and connection of the cooling-body parts 2, 2', 2" to one another is greatly simplified, and the reliability of the cooling body 1 is increased.

A thermally well-conducting material is advantageous as material for the cooling body 1 of the invention. If a high electrical insulating capability is necessary, the cooling body 1 can preferably comprise insulator parts such as aluminum nitride, silicon carbide, aluminum oxide, beryllium oxide, silicon oxide or layered bodies provided with thermally well-conducting coatings, for example comprising the aforementioned insulator group or diamond.

The multiple-part cooling body 1 of the invention preferably comprises insulating, preferably totally ceramic parts 2 and 2' and a metal or insulating center part 2".

We claim:

1. A cylindrical cooling body comprising an upper part, a lower part and lugs that are attached with material-to-material bonding to at least one inside surface of the upper and lower parts, said lugs projecting into a cooling medium and being separated by channels, the cooling medium having an inlet and an outlet wherein:

the ratio of the volume percent of said lugs to the volume percent of said channels is greater in a region of an imaginary, direct connecting line located between the cooling-medium outlet and the cooling-medium inlet than in the regions outside the imaginary, direct connecting line whereby said lugs are distributed within a flow space of the cooling medium such that a uniform flow rate is achieved.

2. The cylindrial cooling body according to claim 1, wherein the ratio of the volume percent of said lugs to the volume percent of said channels is a filling ratio, said filling ratio of the lugs in the region of the imaginary, direct connecting line being high and becoming lower in regions further away from the imaginary, direct connecting line so that flow resistance is approximately the same over the surface of the upper or lower part for each possible flow path between the cooling-medium outlet and the cooling-medium inlet.

3. A cylindrical cooling body according to claim 1, wherein the region along the imaginary, direct connecting line between a cooling-medium outlet and a cooling-medium inlet is at least as wide as the smaller of the diameters of the cooling-medium outlet and the cooling-medium inlet.

4. The cooling body according to claim 1, wherein the ratio of the volume percent of the channels to the volume percent of the lugs is between 1:1 and 2:1.

5. The cylindrical cooling body according to claim 1, wherein the lugs are essentially configured to converge to a point, with the largest surface of the lugs being in contact with the inside surface part of the cooling body.

6. The cylindrical cooling body according to claim 1, wherein the outline of the lugs is polygonal.

7. The cooling body according to claim 1, wherein the lugs are disposed along the flow path with an opening angle of 40° to 60°.

8. The cylindrical cooling body according to claim 1, wherein the outline of the lugs is rhomboid.

9. The cylindrical cooling body according to claim 7, wherein the outline of the lugs is triangular.

10. The cylindrical cooling body according to claim 8, wherein an angle-bisecting end of a corner of the lugs that is surrounded by flow is disposed essentially parallel to the flow path of the cooling medium.

11. The cylindrical cooling body according to claim 1, wherein the inside surfaces of the upper and the lower cooling-body parts are provided with lugs.

12. The cylindrical cooling body according to claim 1, wherein the lugs of the inside of the upper cooling-body part and the lugs of the inside of the lower cooling-body part are disposed mirror-symmetrically with respect to one another, or offset with respect to one another.

13. The cylindrical cooling body according to claim 1, wherein the volume percent of said lugs is designed so that the maximum cooling-medium flow speed along the channels is lower than the speed that causes abrasive damage to the cooling body.

14. The cooling body according to claim 1, wherein the volume percent of said lugs is designed so that the maximum cooling-medium flow speed is not more than 50% above or below the flow-speed maximum along the channels.

15. The cylindrical cooling body according to claim 1, wherein the heat resistance of the cooling body is lower than 25 K/kW.

16. The cylindrical cooling body according to claim 1, wherein the cooling body is formed from an insulator such as aluminum oxide, beryllium oxide and/or silicon oxide.

17. The cylindrical cooling body according to claim 1, wherein the cooling body is coated with a heat-conducting material such as aluminum nitride, silicon carbide, aluminum oxide, silicon oxide and/or diamond.

18. The cylindrical cooling body according to claim 1, wherein the cooling body further comprises an intermediary center part which is located between the upper and lower parts.

19. The cylindrical cooling body according to claim 18, wherein the center cooling-body part is detachably connected to the upper and lower parts.

20. The cylindrical body according to claim 18, wherein the center cooling-body part comprises a metal, or an electrically-insulating material.

21. The cylindrical cooling body according to claim 18, wherein the center cooling-body part comprises a layered body having electrically-insulating coatings.

22. The cylindrical cooling body according to claim 18, wherein the center cooling-body part is provided with cooling-medium connections.

* * * * *